(12) United States Patent
Groeneweg

(10) Patent No.: US 6,501,408 B2
(45) Date of Patent: Dec. 31, 2002

(54) FINITE IMPULSE RESPONSE DIGITAL TO ANALOG CONVERTER WITH OFFSET COMPENSATION

(75) Inventor: Willem Hendrik Groeneweg, Muri (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/156,411

(22) Filed: May 28, 2002

(65) Prior Publication Data

US 2002/0140588 A1 Oct. 3, 2002

Related U.S. Application Data

(63) Continuation of application No. 09/722,832, filed on Nov. 27, 2000, now Pat. No. 6,424,278.

(30) Foreign Application Priority Data

Nov. 26, 1999 (EP) .............................................. 99203989

(51) Int. Cl.[7] ................................................. H03M 1/66
(52) U.S. Cl. ...................................... 341/144; 341/120
(58) Field of Search ................................. 341/144, 143, 341/118, 120

(56) References Cited

U.S. PATENT DOCUMENTS

| | | | |
|---|---|---|---|
| 5,508,702 A | 4/1996 | Estrada et al. .............. | 341/136 |
| 6,100,833 A | 8/2000 | Park ........................... | 341/144 |
| 6,177,896 B1 * | 1/2001 | Min ............................ | 341/143 |
| 6,229,466 B1 | 5/2001 | Gattani ....................... | 341/120 |
| 6,232,903 B1 | 5/2001 | Koifman et al. ............ | 341/144 |
| 6,424,278 B1 * | 7/2002 | Groeneweg ................. | 341/120 |

* cited by examiner

Primary Examiner—Michael Tokar
Assistant Examiner—Joseph Lauture
(74) Attorney, Agent, or Firm—Aaron Waxler

(57) ABSTRACT

A FIRDAC (20) is described, coupled to a noise-shaper (12) with a DC offset. The resulting offset of the FIRDAC itself is compensated by a compensation current source ($P_{comp}$; $N_{comp}$) which is continuously ON.

The FIRDAC has a plurality of FIRDAC cells (40), each cell comprising at least one current source (50; 70). In a FIRDAC cell having a relatively small current source, a dummy transistor (80; 90) is formed in the free space. The compensation current source is formed as a parallel combination of certain dummy transistors.

In a possible embodiment, each FIRDAC cell (40) comprises a stack comprising a D-flipflop (60), a PMOS current mirror (50) above the flipflop, and an NMOS current mirror (70) below the flipflop. In a cell with relatively small PMOS and NMOS current mirrors, a dummy current mirrors (80; 90) are formed in the substrate (100). A plurality of these dummy current mirrors (90; 80) are connected in parallel to constitute said compensation current source ($N_{comp}$, $P_{comp}$). FIG. 4.

8 Claims, 4 Drawing Sheets

FINITE IMPULSE RESPONSE DIGITAL TO ANALOG CONVERTER WITH OFFSET COMPENSATION

CROSS REFERENCE TO RELATED APPLICATION

This is a continuation Ser. No. 09/722,832 filed Nov. 27, 2000 now U.S. Pat. No. 6,424,278.

The present invention relates in general to a finite impulse response digital-to-analog converter, hereinafter referred to as FIRDAC.

The finite impulse response principle for a digital-to-analog converter is known per se, and described for instance in U.S. Pat. No. 5,323,157. Generally speaking, a FIRDAC comprises a shift register with a large number of stages, typically more than hundred stages, which receives a bitstream input signal of one bit, i.e. a serial data stream with one bit amplitude resolution. Each of the stages of the shift register switches a dedicated current source ON or OFF. The currents thus generated by all of the stages of the shift register are added to generate an output current of the FIRDAC. Usually, the output current is applied to a current-to-voltage converter to generate an analog output voltage of the FIRDAC. Each stage of the FIRDAC produces an output current contributing to the overall output current of the FIRDAC. However, the stages of the FIRDAC do not all contribute in the same extent. In order to obtain a desired filter characteristic, each stage of the FIRDAC has an associated weighting coefficient, which is constituted by the magnitude of the output current of the current source.

In a typical application situation, the FIRDAC is used in a signal-processing path of a mobile telephone for providing an analog audio signal to a speaker or earphone. The FIRDAC receives its input bitstream signal from a noise shaper, which increases the signal-to-noise ratio of the FIRDAC by shifting quantisation noise from the voice band to higher frequencies. Due to spurious influences, noise shapers have a tendency of repeating certain patterns, leading to small audible tones, called "idle tones". In order to prevent said idle tones from being audible, it is known per se to digitally offset the noise shaper with a fixed amount, called "DC dither", resulting in the idle tones being pushed to a high frequency above an audible level.

A problem in this respect is that the fixed offset of the noise shaper causes an offset in the FIRDAC, and hence an offset in a driver which receives the FIRDAC output signal and generates a driving signal for the earphone or speaker. In practical cases, the offset can be as much as 80 mV. With earphones having a resistance of 8–16 Ohm, this leads to a large and undesirable current consumption in the order of 10 mA.

The present invention aims to overcome this problem.

More particularly, the present invention aims to overcome said problem without having to increase any chip area occupied by the FIRDAC.

According to an important aspect of the present invention, a current output terminal of the FIRDAC is coupled to a constant current source or sink, adding or subtracting a constant compensation current to or from the output current of the FIRDAC in order to compensate or, preferably, to eliminate said offset.

According to a further aspect of the present invention, in a preferred embodiment, each stage of the FIRDAC comprises in combination a D-flipflop, a PMOS current mirror, and an NMOS current mirror. Each stage of the FIRDAC occupies substantially the same semiconductor space. The flipflops all have the same width, but the transistor widths of the PMOS current mirrors and the transistor widths of the NMOS current mirrors are different and determine the magnitude of the current output of said mirror in order to implement the weighting coefficient of each stage. Consequently, in FIRDAC stages with a relatively low weighting coefficient, the size of the PMOS current mirror and the size of the NMOS current mirror is relatively small, hence a relatively large amount of space is "free". In said free space, dummy current sources are arranged.

As a consequence of the DC offset in the bitstream generator ("noise-shaper"), the FIRDAC itself has an offset output level. More particularly, a positive current output of the FIRDAC produces too much positive current whereas a negative current output produces too much negative current. According to an important aspect of the present invention, this is compensated by a constant current source being coupled to a current output.

In the case of a positive current output which produces too much positive current, the invention provides a predetermined number of spare dummy NMOS current sinks that are continuously ON, and which sink away the excess current (the offset) from the positive current sources to ground.

In the case of a negative current output which produces too much negative current, the invention provides a predetermined number of spare dummy PMOS current sources that are continuously ON, and which supplement the excess current (the offset) drawn to ground by the negative current sources.

The amount of offset in the bitstream generator generating the bitstream as input signal for the FIRDAC is known and constant. This means that, before manufacture of the FIRDAC, it is possible to calculate how much compensating current is to be conducted by the dummy NMOS current sources. Hence, it is possible to predetermine which dummies to use and which not.

If the available number of NMOS dummies appears to be too small for an adequate compensation, it is possible to use PMOS dummies for compensation.

These and other aspects, characteristics and advantages of the present invention will be further clarified by the following description of a preferred embodiment of a control circuitry in accordance with the invention, with reference to the drawings, in which same reference numerals indicate equal or similar parts, and in which.

Figure 1:
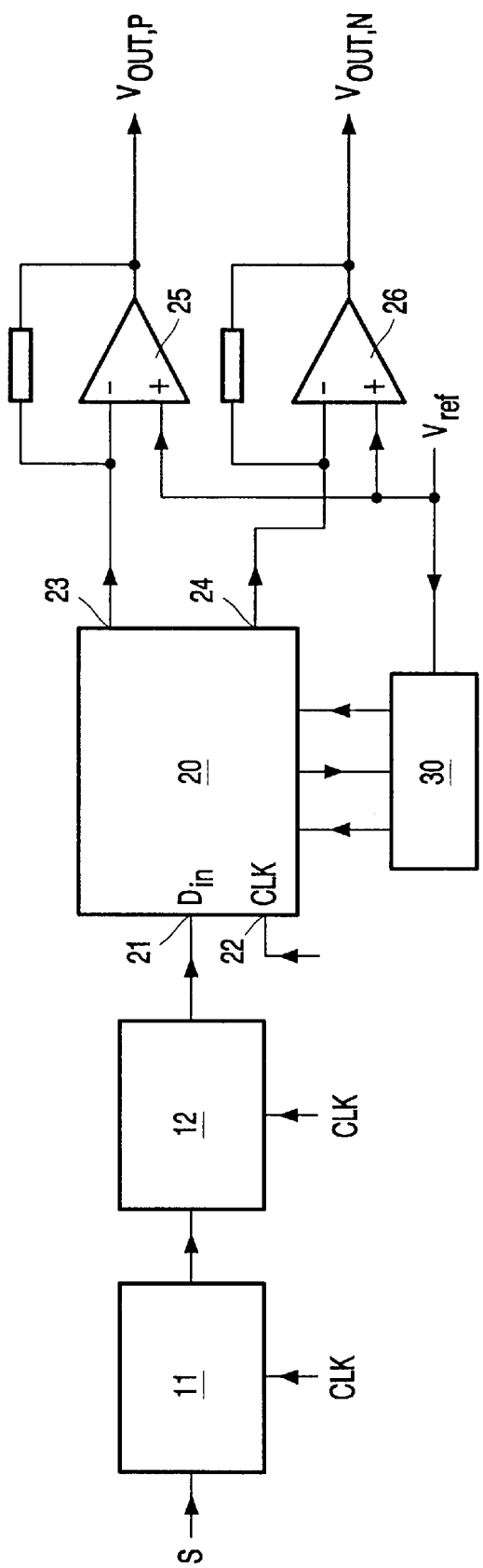
FIG. 1 shows a block diagram of an example of a circuit for processing a voice signal.

FIG. 1 shows a block diagram of a possible circuit for processing a voice signal S in a mobile telephone. The circuit comprises a digital filter 11 and a noise-shaper or bitstream generator 12, both of which may be of conventional design, for which reason they will not be described in more detail here. The digital filter 11 is arranged for suppressing frequencies outside the voice band, i.e. below 300 Hz and above 3400 Hz. The digital filter 11 has an output connected to an input of the noise-shaper 12, which is arranged for providing a resulting 1 MHz bitstream (1-bit) signal at its output, which is connected to a signal input 21 of a FIRDAC 20. A bias block 30 receives a reference voltage such as a bandgap voltage $V_{ref}$, and is coupled to the FIRDAC for providing a number of bias currents.

The FIRDAC 20 has a clock input 22 for receiving a clock input signal CLK. Similarly, the digital filter 11 and the noise-shaper 12 have clock input terminals for receiving a clock signal CLK which may or may not be identical to the clock signal for the FIRDAC. The frequency of the clock signal CLK for the FIRDAC 20 depends, inter alia, on the desired signal-to-noise ratio and the frequencies available in the system. For instance, in a GSM system, the frequency of the clock signal may be 1 MHz, which can easily be derived from a GSM master clock frequency of 13.0 MHz.

It is possible to have a FIRDAC with only one output line. However, the FIRDAC 20 of the present invention provides for differential drive in that it has two current output terminals 23 and 24, for generating a positive current and a negative current, respectively, depending whether the bitstream signal contains mainly ones (corresponding to the positive half of the voiceband signal) or mainly zeroes (corresponding to the negative half of the voiceband signal), respectively. The said current signals are fed to current-to-voltage converters 25 and 26, respectively, which generate output voltage signals $V_{OUT,P}$ and $V_{OUT,N}$, respectively, to be fed to output stages such as earphone drivers (not shown).

Figure 2:
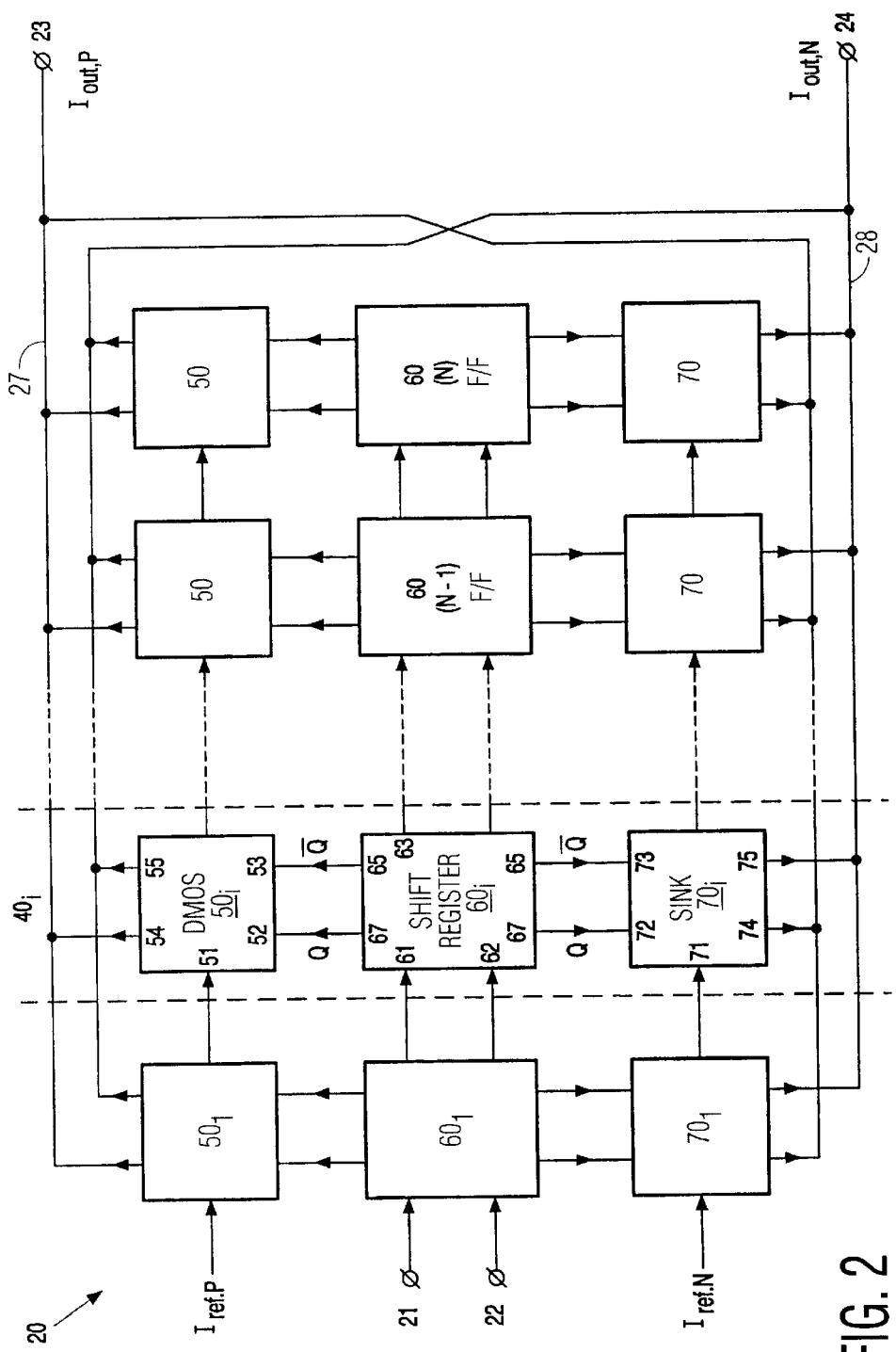
FIG. 2 shows a block diagram of a FIRDAC.

FIG. 2 schematically illustrates an internal block diagram of the FIRDAC 20. The FIRDAC 20 comprises a plurality of N FIRDAC cells 40. Hereinafter, identical elements of the FIRDAC circuit 20 will be indicated by identical reference numerals, while a subscript i refers to the position of such element in the FIRDAC circuit. Each FIRDAC cell $40_i$ comprises a PMOS current source $50_i$, a shift register cell $60_i$, and an NMOS current sink $70_i$.

Each PMOS current source $50_i$ has a reference current input $51_i$ for receiving a reference current $I_{ref,P}$, first and second binary control inputs $52_i$ and $53_i$ for receiving binary control signals, and first and second current output terminals $54_i$ and $55_i$ for providing a positive output current $I_{Pi}$.

Similarly, each NMOS current sink $70_i$ comprises an input $71_i$, first and second control inputs $72_i$ and $73_i$, and first and second current outputs $74_i$ and $75_i$.

Each shift register cell $60_i$ is constituted by a D-type flipflop, and comprises a Q-output $67_i$ and a Q$^-$; -output $65_i$. The Q-output $67_i$ is coupled to the first binary control input $52_i$ of the corresponding PMOS current source $50_i$ and to the first binary control input $72_i$ of the corresponding NMOS current sink $70_i$. The Q$^-$; -output $65_i$ is coupled to the second binary control input $53_i$ of the corresponding PMOS current source $50_i$ and to the second binary control input $73_i$ of the corresponding NMOS current sink $70_i$.

Each D-type flipflop $60_i$ has a signal input $61_i$ and a signal output $63_i$. The signal input $61_i$ is connected to the signal output $63_{i-1}$ of the previous flipflop $60_{i-1}$. The signal input $61_1$ of the first flipflop $60_1$ is connected to the input terminal 21 of the FIRDAC 20. Further, each D-type flipflop $60_i$ has a clock input $62_i$ connected to the clock input terminal 22 of the FIRDAC 20. At a rate determined by the frequency of the clock signal applied to the clock input 22 of the FIRDAC 20, typically 1 MHz, the bitstream signal is shifted into the shift register. At each moment in time, a flipflop state corresponds to the value of a bit in the bitstream signal. If a bit has a value "1", the Q-output 67 of the corresponding flipflop 60 is HIGH and the Q$^-$;-output 65 of this flipflop is LOW: in this situation, the corresponding PMOS current source 50 is coupled to a positive current output line 27 while the corresponding NMOS current sink 70 is coupled to a negative current output line 28. Otherwise, if a bit has a value "0", the Q-output 67 of the corresponding flipflop 60 is LOW while the Q$^-$; -output 65 of this flipflop is HIGH; in this situation, the PMOS current source 50 is coupled to the negative current output line 28 while the NMOS current sink 70 is coupled to the positive current output line 27. The positive current output line 27 is connected to the positive current output terminal 23, whereas the negative current output line 28 is connected to the negative current output terminal 24.

At the positive output 23 of the FIRDAC 20, the positive output signal $I_{OUT,P}$ is the summation of all output currents $I_{Pi}$ of those PMOS current sources $50_i$ which are coupled to the positive current output line 27 and of all output currents $I_{Ni}$ of those NMOS current sources $70_i$ which are coupled to the positive current output line 27. Similarly, at the negative current output 24, the negative output current $I_{OUT,N}$ is the summation of all output currents $I_{Ni}$ of those NMOS current sinks $70_i$ which are coupled to the negative current output line 28 and of all output currents $I_{Pi}$ of those PMOS current sources $50_i$ which are coupled to the negative current output line 28. Thus, the positive and negative output currents $I_{OUT,P}$ and $I_{OUT,N}$ depend on the portion of the bitstream signal currently present in the shift register, each bit corresponding to a positive or negative current contribution, whereas the total output current $I_{OUT,P}+I_{OUT,N}$ remains constant.

However, the current contributions of different current sources or current sinks, respectively, differ from each other, embodying the weighting coefficient of the different FIRDAC stages, which are selected to obtain a desired response characteristic of the FIRDAC, as will be clear to a person skilled in the art. Typically, the coefficients are symmetrical around the centre stage, the cells located near the input side or near the output side of the FIRDAC 20 contributing with a relatively small output current, and the cells located near the centre of the FIRDAC 20 contributing with a relatively high output current. For each cell, $40_i$, the magnitude of the output currents $I_{Pi}$ and $I_{Ni}$ generated by the PMOS current sources $50_i$ and the NMOS current sink $70_i$, respectively, is determined by the width of the PMOS current source $50_i$ and the NMOS current source $70_i$, respectively. The larger the current source or current sink, the larger the generated current.

Figure 3:
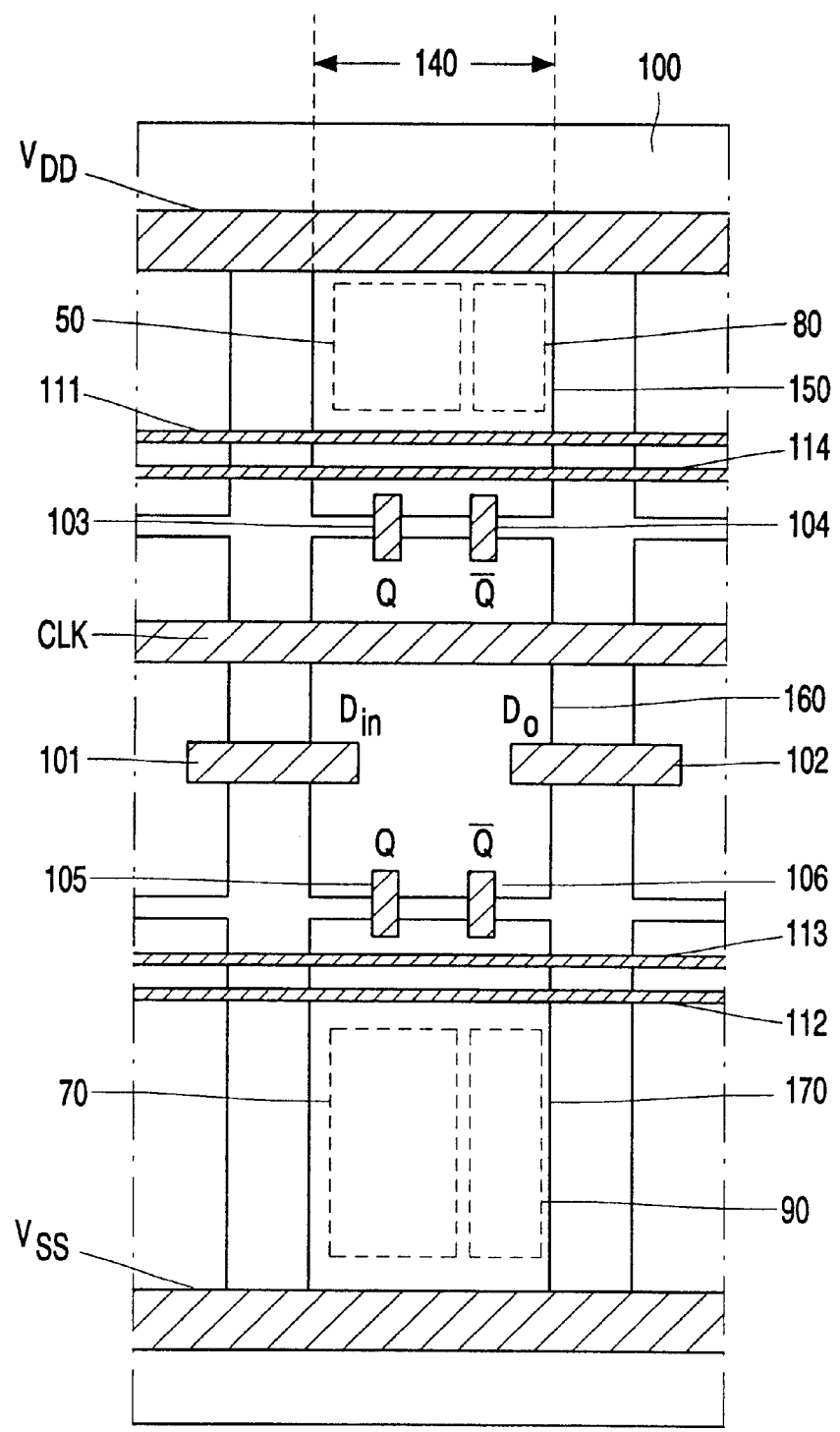
FIG. 3 illustrates schematically a cross section of a part of a piece of semiconductor material, in which a FIRDAC cell is formed.

In an integrated circuit, the cells 40 are arranged next to each other. In each cell $40_i$, the PMOS current source $50_i$ is located above the corresponding flipflop $60_i$ and the NMOS current sink $70_i$ is located below this flipflop $60_i$. Thus, each cell 40 takes up a column-shaped section 140 of the semiconductor substrate 100, as illustrated in FIG. 3.

In a central portion 160 of the column-shaped semiconductor section 140, a flipflop 60 is formed; hereinafter, this central portion 160 will also be referred to as flipflop portion. In a higher portion 150 of the column-shaped semiconductor section 140, located above the central portion 160, a PMOS current source 50 is formed; hereinafter, this higher portion 150 will also be referred to as PMOS portion. In a lower portion 170 of the column-shaped semiconductor section 140, located below the central portion 160, an NMOS current sink 70 is formed; hereinafter, this lower portion 170 will also be referred to as NMOS portion.

A first signal conductor 101 connects the input terminal $D_{in}$ to an output terminal of the previous cell. A second signal conductor 102 connects the output terminal $D_o$ to the input terminal of the next cell. A third signal conductor 103 connects the Q-output signal from the flipflop portion 160 to the PMOS portion 150. A fourth signal conductor 104 connects the Q⁻; -output signal from the flipflop portion 160 to the PMOS portion 150. Similarly, fifth and sixth signal conductors 105 and 106 connect the Q-output signal and the Q⁻; -output signal, respectively, from the flipflop portion 160 to the NMOS portion 170.

A continuous clock line CLK extends along all flipflop portions 160. A first continuous positive output line 111 extends along all PMOS portions 150, and a first continuous negative output line 112 extends along all NMOS portions 170. A second continuous positive output line 113 extends along all NMOS portions 170, and a second continuous negative output line 114 extends along all PMOS portions 150. Also, a first supply line $V_{DD}$ extends along all PMOS portions 150, and a second supply line $V_{SS}$ extends along all NMOS portions 170. At the output side of the FIRDAC 20, the first and second positive output lines 111 and 113 are coupled together; the same applies for the first and second negative output lines 112 and 114.

The flipflops 60 in the FIRDAC cells 40 are mutually identical, i.e. their physical sizes are mutually identical. As the physical width of the column-shaped semiconductor section 140 is determined by the physical width of the flipflop portion 160, the widths of the column-shaped semiconductor sections 140 are mutually identical. Consequently, the widths of the PMOS portions 150 are mutually identical, and the widths of the NMOS portions 170 are mutually identical.

As mentioned above, a FIRDAC cell 40 which is located near the centre of the FIRDAC 20 generates a relatively large current as compared to a FIRDAC cell located further away from the centre of the FIRDAC. As the magnitude of the output current generated by the PMOS current source 50 and the NMOS current sink 70, respectively, of a cell 40 is determined by the width of the PMOS current source 50 and the NMOS current source 70, respectively, this means that the width of the PMOS current source and NMOS current sink of a FIRDAC cell which is located further away from the centre of the FIRDAC is smaller than the width of the PMOS current source and NMOS current sink of a FIRDAC cell which is located near the centre of the FIRDAC.

In practice, the width of the PMOS current source and NMOS current sink in a central FIRDAC cell is approximately equal to the width of the corresponding flipflop 60. This means that the PMOS portion 150 of such centrally located cell is almost entirely occupied by the PMOS current source 50 formed therein, and the same applies to the corresponding NMOS portion 170. However, in a cell 40 which is located further away from the central cells, the PMOS current source 50 and the NMOS current sink 70 have smaller sizes, and accordingly they do not physically occupy all the space available in the PMOS portion 150 and the NMOS portion 170, respectively. According to an important aspect of the present invention, an additional or "dummy" transistor 80 is formed in that part of the PMOS portion 150 which is not occupied by the PMOS current source 50, and an additional or "dummy" transistor 90 is formed in that part of the NMOS portion 170 which is not occupied by the NMOS current sink 70.

One advantage of a dummy transistor 80 or 90 filling up the available space in a FIRDAC cell 40 not occupied by a PMOS or NMOS transistor 50 or 70, respectively, is that the surroundings for all shift register cells 60 are substantially equal.

Further, according to an important aspect of the present invention, said dummy transistors 80 and 90 can be advantageously used in the bias circuit 30, as will be explained hereinafter.

Figure 4:
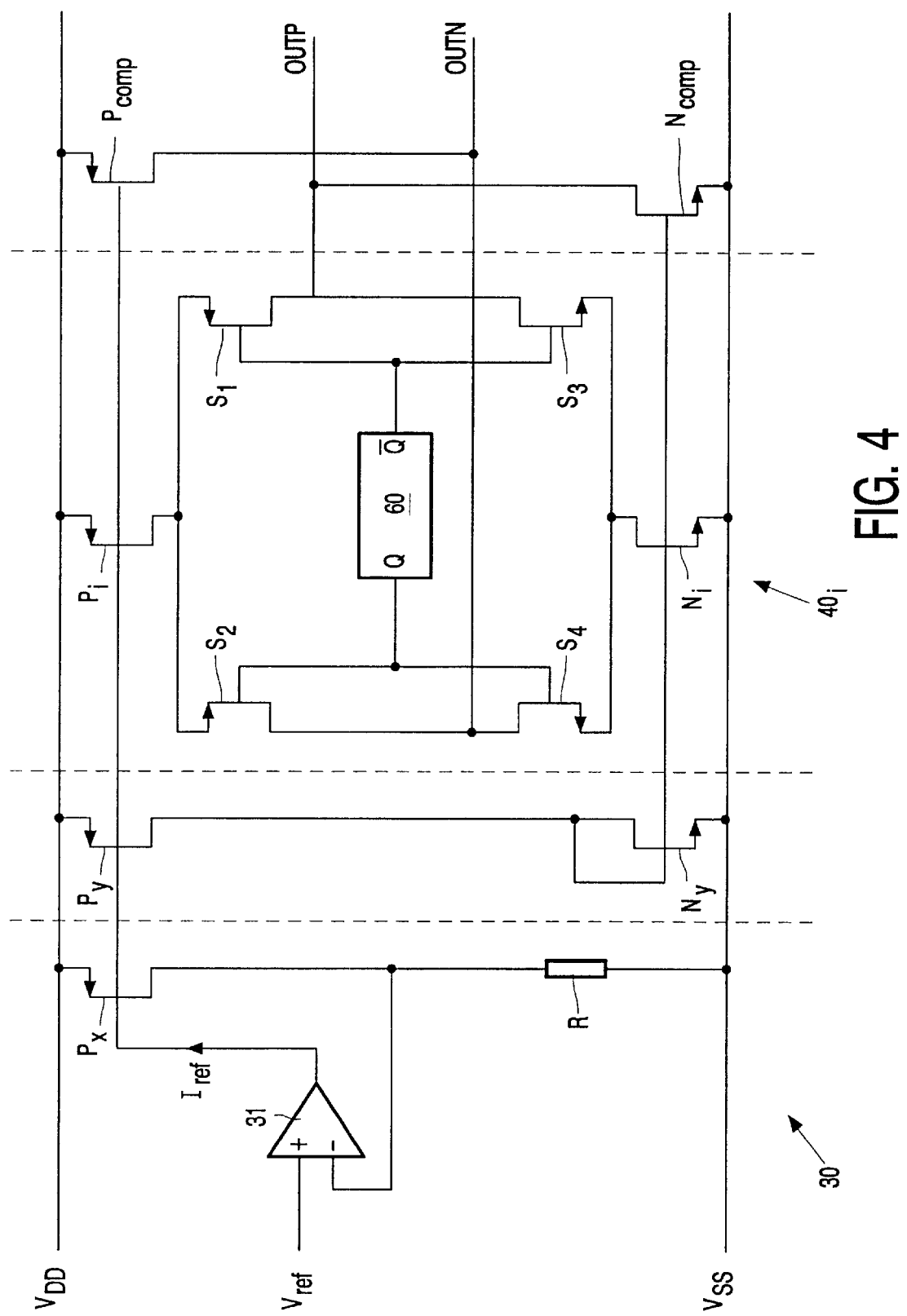
FIG. 4 shows a circuit diagram of an embodiment of the invention.

FIG. 4 illustrates the circuit of the bias block 30 and the FIRDAC 20. The bias circuit 30 comprises an amplifier 31 receiving a reference voltage $V_{ref}$ at its non-inverting input, and having its output coupled to the gate of a P-transistor $P_X$. The source of the P-transistor $P_X$ is connected to a supply line $V_{DD}$, and the drain of the P-transistor $P_X$ is connected to one terminal of a resistor R, while the other terminal of the resistor R is connected to a second supply voltage $V_{SS}$. As usually, the voltage level of the second voltage supply line $V_{SS}$ is lower than the voltage level of the first voltage supply line $V_{SS}$, and normally at ground level. The node between the drain of the P-transistor $P_X$ and the resistor R is connected to the inverting input of the amplifier 31.

The P-transistor $P_X$ can be a separate transistor. However, the P-transistor $P_X$ is preferably constituted by a parallel combination of a plurality of P-dummy transistors 80 in a plurality of FIRDAC cells 40.

The bias circuit 30 further comprises a second P-transistor $P_Y$ having its source connected to the first supply line $V_{DD}$ and its gate connected to the gate of the P-transistor $P_X$, and an N-transistor $N_Y$ having its source connected to the second supply line $V_{SS}$ and having its gate and its drain connected to the drain of the P-transistor $P_Y$.

The transistors $P_Y$ and $N_Y$ can be implemented as separate transistors, but preferably they are implemented by a parallel combination of a predetermined number of dummy transistors 80 and 90, respectively.

As an alternative with improved current accuracy with respect to supply tolerances and parameter tolerances, the transistor $P_Y$ might be coupled to the transistor $N_Y$ by a cascode transistor $P_{CY}$ (not shown), having its gate connected to further reference (or bias) voltage.

In FIG. 4, only one FIRDAC cell $40_i$ is shown, but all FIRDAC cells have a similar build-up, as will be clear to a person skilled in the art. Each FIRDAC cell $40_i$ comprises a P-transistor $P_i$ having its source coupled to the first supply line $V_{DD}$ and having its gate coupled to the gate of said P-transistor $P_Y$, and further comprises an N-transistor $N_i$ having its source connected to the second supply line $V_{SS}$ and having its gate connected to the gate of said N-transistor $N_Y$. The drain of the P-transistor $P_i$ of the FIRDAC cell $40_i$ is coupled to a positive output line OUTP through a first switch S1, and is coupled to a negative output line OUTN through a second switch S2. Similarly, the drain of the N-transistor $N_i$ of the FIRDAC cell $40_i$ is coupled to the positive output line OUTP through a third switch S3, and is coupled to the negative output line OUTN through a fourth switch S4.

The switches S1 and S3 are controlled by the inverted output Q⁻; 65 of the flipflop 60, and the second and fourth switches S2 and S4 are controlled by the output Q 67 of the flipflop 60. More particularly, the first switch S1 is implemented as a P-transistor having its source connected to the drain of transistor $P_i$, having its drain connected to the positive output line OUTP, and having its gate connected to the inverted output Q⁻; of the flipflop 60. The second switch S2 is implemented as a P-transistor having its source connected to the drain of transistor $P_i$, having its drain connected to the negative output line OUTN, and having its gate connected to output Q of the flipflop 60. The third transistor S3 is implemented as an N-transistor having its source connected to the drain of transistor $N_i$, having its drain connected to the positive output line OUTP, and having its gate connected to the inverted output Q⁻; of flipflop 60. The fourth switch S4 is implemented as an N-transistor having its source connected to the drain of transistor $N_i$, having its drain connected to the negative output line OUTN, and having its gate connected to the output Q of flipflop 60.

As an alternative with improved current accuracy with respect to clock feedthrough and supply tolerances, the P-switches S1 and S2 might be coupled to the output lines OUTP and OUTN, respectively, by respective P-type cascode transistors (not shown), while the N-switches S3 and S4 might be coupled to the output lines OUTP and OUTN, respectively, by respective N-type cascode transistors (not shown), wherein the gates of such cascode transistors are supplied by a stable bias voltage.

All FIRDAC cells $40_i$ are coupled to the positive and negative output lines OUTP and OUTN, respectively, in a similar manner.

If the flipflop 60 contains a bit value "1", output Q is HIGH and output Q⁻; is LOW. In this situation, the switches S1 and S4 are conducting, while the switches S2 and S3 are non-conductive. Thus, the positive output line OUTP is connected through switch S1 to the drain of transistor $P_i$, and this transistor $P_i$, acting as current source, delivers its output current to positive output line OUTP. Similarly, in this situation the negative output line OUTN is connected to the transistor $N_i$ through switch S4, this transistor $N_i$ acting as current sink for output line OUTN.

If the flipflop 60 contains a bit value "0", the output Q is LOW and the output all Q⁻; is HIGH. In this condition, the switches S2 and S3 are conductive while the switches S1 and S4 are non-conductive. Thus, the current source $P_i$ is now connected to the negative output line OUTN while the current sink $N_i$ is connected to positive output line OUTP.

It is noted that a FIRDAC with only one output line, wherein the current source $P_i$ and the current sink $N_i$ are both connected to such one output line, is possible. However, the FIRDAC 20 of the present invention provides two output signals on the two output lines OUTP and OUTN, more particularly a positive output signal on the positive output line OUTP and a negative output signal on the negative output line OUTN, in order to provide for differential drive.

As explained above, the noise-shaper 12 is equipped with "DC dither", i.e. that for a "zero" input signal at the input of the noise-shaper, the output bitstream is not 50% ones and zeroes but has a slight offset in order to push any possible idle tones out of the voiceband region into the region above 20 kHz. As a consequence, the flipflops of the FIRDAC 20 receive to many ones, i.e. the output Q is switched to HIGH slightly too long, hence the output lines OUTP and OUTN receive too much current. FIG. 4 illustrates that, according to the present application, this is compensated by coupling the positive output line OUTP to the second voltage supply line $V_{SS}$ through an N-transistor $N_{comp}$, and by coupling the negative output line OUTN to the first voltage supply line $V_{DD}$ through a P-transistor $P_{comp}$. These compensation transistors $N_{comp}$ and $P_{comp}$ have their gates connected to the gates of $N_Y$ and $P_Y$, respectively, have their sources connected to $V_{SS}$ and $V_{DD}$, respectively, and have their drains connected to output lines OUTP and OUTN, respectively, so that these compensation transistors $N_{comp}$ and $P_{comp}$ are continuously in the conductive state.

In FIG. 4, the compensation transistors $N_{comp}$ and $P_{comp}$ are illustrated as single transistors. Indeed, it is possible to provide separate compensation transistors $N_{comp}$ and $P_{comp}$. However, according to an important aspect of the present invention, dummy transistors 80 and 90 are used for providing the compensation current as shown in FIG. 4. More particularly, the compensation transistor $P_{comp}$ is preferably implemented as a plurality of dummy P-transistors 80 coupled in parallel, and the compensation transistor $N_{comp}$ is preferably implemented as a plurality of dummy N-transistors 90 coupled in parallel. Thus, the dummy transistors in the free spaces of the FIRDAC cells are used advantageously.

The amount of DC offset in the noise-shaper 12 is a known design parameter of the noise-shaper 12, and is constant. Therefore, it is possible to calculate beforehand the required amount of compensation current for the output lines OUTP and OUTN. As explained above, the PMOS portions $150_i$ of the FIRDAC cells $40_i$ all have substantially the same size, but the PMOS current sources $50_i$ is these PMOS portions $150_i$ of the FIRDAC cells $40_i$ have mutually different sizes, the PMOS current sources $50_i$ near the centre of the FIRDAC 20 being larger than the PMOS current sources $50_i$ near the ends of the FIRDAC 20. Therefore, the dummy transistors $80_i$ have mutually different sizes, the dummy transistors $80_i$ near the ends of the FIRDAC 20 being larger than the dummy transistors $80_i$ near the centre of the FIRDAC 20. Since the amount of current provided by such dummy transistors $80_i$ depends on its size, the dummy transistors $80_i$ near the ends of the FIRDAC 20 would provide larger currents than the dummy transistors $80_i$ near the centre of the FIRDAC 20. The same applies for the NMOS dummy transistors $90_i$.

Since the sizes of the dummy transistors $80_i$ and $90_i$ are also known beforehand, it is known beforehand how much current each of the dummy transistors would provide. Consequently, it is possible to select individual dummy transistors $80_i$ and $90_i$ in such a way, that their combined output current substantially corresponds to the required compensation current. In other words, not all of the dummy transistors $80_i$ and $90_i$ are to be used as compensation transistor, but a few specific pre-selected individual dummy transistors $80_i$ and $90_i$ are coupled in parallel to function as compensation transistor whilst others are not used.

One advantage is in this respect that the dummy P-transistors and the dummy N-transistors of the FIRDAC cells are thus, as explained above, not idle transistors but they are put to advantageous use. Further, these dummy transistors may also used to implement the transistors $P_X$, $P_Y$ and $N_Y$ in the bias circuit 30.

Another advantage is that the problem of eliminating the offset in the FIRDAC is solved without involving additional semiconductor area.

It should be clear to a person skilled in the art that the scope of the present invention is not limited to the examples discussed in the above, but that several amendments and modifications are possible without departing from the scope of the invention as defined in the appending claims.

In the foregoing, the present invention is explained with respect to a DC offset. However, it is also possible to use "AC dither" according to a known digital AC pattern. Such an AC offset can also be compensated, but then the compensation transistors cannot be switched on continuously but must be switched on and off with the same pattern as the AC dither.

Further, in the foregoing, the present invention is explained with respect to a PMOS current source located above a flipflop and an NMOS current source located below this flipflop. However, the PMOS current source may also be located below the flipflop, in which case the NMOS current source will be located above this flipflop. In any case, the relative locations of the PMOS current source, the NMOS current source and the flipflop with respect to each other are no primary essential feature of the invention.

Further, with particular reference to FIG. 2, the present invention is explained with respect to an example where the flipflop 60 provides both Q and Q⁻; signals to both the PMOS current source and to the NMOS current source. However, it is also possible that the PMOS current source and the NMOS current source receive only one of said signals Q or Q⁻; and comprise an inverter for deriving the inverted signal Q⁻; or Q from the received signal Q or Q⁻;.

Further, in the foregoing the invention is described for a FIRDAC of the type having two output lines, one for positive output current and one for negative output current, wherein each FIRDAC cell contributes a positive current to the positive current output line and a negative current to the negative current output line in a first state of the cell (bit value "1"), and wherein each FIRDAC cell contributes said positive current to the negative current output line and said negative current to the positive current output line in a second state of the cell (bit value "0"). The invention is, however, also applicable in the context of a FIRDAC of which the FIRDAC cells would, in the second state of the cells (bit value "0"), deliver no current to any of the current output lines.

Further, although the invention is explained for the case of a FIRDAC providing for differential drive by providing a positive and a negative output current on two different output lines, the present invention is also applicable to a FIRDAC with only one current output line, wherein each FIRDAC stage comprises only a current source of one type (for instance P-type) which is switched ON or OFF by the flipflop. In such case, a current source of second type (N-type) might be coupled to the current output line. However, then it is also possible to invert the bitstream signal and to use a current source of the first type (P-type) for current compensation.

Further, the invention is explained for a case where the offset in the noise shaper 12 results in the shift register cells 60 being too long in the "1" state. It is, however, also possible that the offset in the noise shaper 12 results in the shift register cells 60 being too long in the "0" state. IN such case, a positive output line OUTP would receive too little positive current, which should be compensated by a positive compensation current source being coupled to the positive output line, whereas a negative output line OUTN would receive too little negative current, which should be compensated by a negative compensation current source being coupled to the negative output line.

What is claimed is:

1. FIRDAC (20) comprising at least one current output (23; 24) and a plurality of FIRDAC cells (40), each cell (40) comprising:

a shift register cell (60);

at least one current source (50; 70) controlled by the corresponding shift register cell (60) for coupling a FIRDAC cell current contribution ($I_{Pi}$; $I_{Ni}$) to said at least one current output (23; 24); the FIRDAC (20) further comprising a compensation current source ($N_{comp}$; $P_{comp}$) coupled to said current output (23; 24).

2. FIRDAC according to claim 1, wherein said at least one current source (50) is arranged for generating a positive current contribution ($I_{Pi}$) to said at least one current output (23), and wherein said compensation current source ($N_{comp}$) is arranged for generating a predetermined, fixed amount of negative current.

3. FIRDAC according to claim 1, wherein said at least one current source (70) is arranged for generating a negative current contribution ($I_{Ni}$) to said at least one current output (24), and wherein said compensation current source ($P_{comp}$) is arranged for generating a predetermined, fixed amount of positive current.

4. FIRDAC according to claim 2 or 3, wherein said at least one current source (50; 70) comprises a transistor of a first conductivity type (PMOS; NMOS) coupled between said at least one current output (23; 24) and a first supply line ($V_{DD}$; $V_{SS}$), and wherein said compensation current source ($N_{comp}$; $P_{comp}$) comprises a transistor of a second conductivity type (NMOS; PMOS) coupled between said at least one current output (23; 24) and a second supply line ($V_{SS}$; $V_{DD}$).

5. FIRDAC according to claim 1, wherein said at least one current source (50) is arranged for generating a positive current contribution ($I_{Pi}$) to said at least one current output (23), and wherein said compensation current source is arranged for generating a pre-determined, fixed amount of positive current.

6. FIRDAC according to claim 1, wherein said at least one current source (70) is arranged for generating a negative current contribution ($I_{Ni}$) to said at least one current output (24), and wherein said compensation current source is arranged for generating a pre-determined, fixed amount of negative current.

7. FIRDAC according to claim 5 or 6, wherein said at least one current source (50; 70) comprises a transistor of a first conductivity type (PMOS; NMOS) coupled between said at least one current output (23; 24) and a supply line ($V_{DD}$; $V_{SS}$), and wherein said compensation current source comprises a transistor of the same conductivity type coupled between said at least one current output (23; 24) and said supply line ($V_{SS}$; $V_{DD}$).

8. FIRDAC according to any of claims 1–7, wherein said compensation current source ($N_{comp}$; $P_{comp}$) is implemented as a parallel combination of a plurality of transistors (90; 80).

* * * * *